United States Patent
Neufeld

(10) Patent No.: US 11,617,272 B2
(45) Date of Patent: Mar. 28, 2023

(54) SUPERCONDUCTING PRINTED CIRCUIT BOARD RELATED SYSTEMS, METHODS, AND APPARATUS

(71) Applicant: D-WAVE SYSTEMS INC., Burnaby (CA)

(72) Inventor: Richard D. Neufeld, Burnaby (CA)

(73) Assignee: D-WAVE SYSTEMS INC., Burnaby (CA)

( * ) Notice: Subject to any disclaimer, the term of this patent is extended or adjusted under 35 U.S.C. 154(b) by 964 days.

(21) Appl. No.: 16/465,765

(22) PCT Filed: Dec. 7, 2017

(86) PCT No.: PCT/US2017/065152
§ 371 (c)(1),
(2) Date: May 31, 2019

(87) PCT Pub. No.: WO2018/106942
PCT Pub. Date: Jun. 14, 2018

(65) Prior Publication Data
US 2020/0068722 A1 Feb. 27, 2020

Related U.S. Application Data

(60) Provisional application No. 62/431,333, filed on Dec. 7, 2016.

(51) Int. Cl.
*H05K 3/42* (2006.01)
*H05K 1/02* (2006.01)
(Continued)

(52) U.S. Cl.
CPC .......... *H05K 3/429* (2013.01); *H05K 1/0298* (2013.01); *H05K 1/115* (2013.01); *H05K 3/462* (2013.01);
(Continued)

(58) Field of Classification Search
CPC ...... H05K 3/429; H05K 3/462; H05K 1/0298; H05K 1/115; H05K 2201/0154; H05K 2201/0391
(Continued)

(56) References Cited

U.S. PATENT DOCUMENTS 3,343,979 A 9/1967 Hamrin
4,660,061 A 4/1987 Sweeny et al.
(Continued)

FOREIGN PATENT DOCUMENTS

CN 85101736 A 1/1987
CN 1140008 A 1/1997
(Continued)

OTHER PUBLICATIONS

Amin, "Effect of Local Minima on Adiabatic Quantum Optimization," Physical Review Letters 100(130503), 2008, 4 pages.
(Continued)

Primary Examiner — Peter Dungba Vo
Assistant Examiner — Azm A Parvez
(74) Attorney, Agent, or Firm — Cozen O'Connor

(57) ABSTRACT

A multilayer circuit board structure includes superconducting connections to internal layers thereof, for example by inclusion of superconducting vias. Two or more panels can each comprise respective electrically insulative substrates, each have one or more through-holes, and also include a respective bimetal foil on at least a portion of a respective surface thereof, which is patterned to form traces. The bimetal foil includes a first metal that is non-superconductive in a first temperature range and a second metal that is superconductive in the first temperature range. The panels are plated to deposit a third metal on exposed traces of the second metal, the third metal superconductive in the first temperature range. Panels are join (e.g., laminated) to form
(Continued)

at least a three-layer superconducting printed circuit board with an inner layer, two outer layers, and superconducting vias between the inner layer and at least one of the two outer layers.

22 Claims, 8 Drawing Sheets

(51) Int. Cl.
  *H05K 1/11* (2006.01)
  *H05K 3/46* (2006.01)
(52) U.S. Cl.
  CPC ............... *H05K 2201/0154* (2013.01); *H05K 2201/0391* (2013.01)
(58) Field of Classification Search
  USPC ......................................................... 505/220
  See application file for complete search history.

(56) References Cited

U.S. PATENT DOCUMENTS

| | | | |
|---|---|---|---|
| 4,954,480 A * | 9/1990 | Imanaka ............... | C04B 35/645 428/209 |
| 5,430,012 A | 7/1995 | Nakamura et al. | |
| 5,440,239 A | 8/1995 | Zappella et al. | |
| 6,184,477 B1 | 2/2001 | Tanahashi | |
| 6,678,540 B2 | 1/2004 | Wire et al. | |
| 6,747,217 B1 | 6/2004 | Jochym et al. | |
| 6,852,926 B2 | 2/2005 | Ma et al. | |
| 7,135,701 B2 | 11/2006 | Amin et al. | |
| 7,148,483 B1 | 12/2006 | Testardi | |
| 7,533,068 B2 | 5/2009 | Maassen et al. | |
| 7,687,938 B2 | 3/2010 | Bunyk et al. | |
| 7,932,515 B2 | 4/2011 | Bunyk | |
| 8,008,942 B2 | 8/2011 | Van et al. | |
| 8,018,244 B2 | 9/2011 | Berkley | |
| 8,190,548 B2 | 5/2012 | Choi | |
| 8,195,596 B2 | 6/2012 | Rose et al. | |
| 8,315,678 B2 * | 11/2012 | Uchaykin ............... | H05K 3/429 427/63 |
| 8,441,329 B2 | 5/2013 | Thom et al. | |
| 8,649,834 B1 | 2/2014 | Jones | |
| 8,772,759 B2 | 7/2014 | Bunyk et al. | |
| 2006/0147154 A1 | 7/2006 | Thom et al. | |
| 2006/0225165 A1 | 10/2006 | Maassen et al. | |
| 2008/0286989 A1 | 11/2008 | Strauss | |
| 2009/0008632 A1 | 1/2009 | Bunyk et al. | |
| 2009/0099025 A1 * | 4/2009 | Uchaykin ................ | H05K 3/24 29/829 |
| 2009/0173936 A1 | 7/2009 | Bunyk | |
| 2010/0052024 A1 | 3/2010 | Kiyomura et al. | |
| 2011/0022820 A1 | 1/2011 | Bunyk et al. | |
| 2012/0007230 A1 | 1/2012 | Hwang et al. | |
| 2012/0068334 A1 | 3/2012 | Migita et al. | |
| 2013/0234909 A1 | 9/2013 | Koh et al. | |
| 2015/0119252 A1 | 4/2015 | Ladizinsky et al. | |

FOREIGN PATENT DOCUMENTS

| | | |
|---|---|---|
| CN | 103918357 A | 7/2014 |
| TW | 200952589 A | 12/2009 |
| TW | 201734264 A | 10/2017 |
| WO | 2017155531 A1 | 9/2017 |
| WO | 2018106942 A1 | 6/2018 |

OTHER PUBLICATIONS

Ardavan et al., "Nanoscale solid-state quantum computing", Philosophical Transactions of the Royal Society of London, Jun. 11, 2003.
Blatter et al., "Design aspects of superconducting-phase quantum bits," Physical Review B 63: 174511-1-174511-9, 2001.
F. Pobell, "Matter and Methods at Low Temperatures", Springer-Verlag, 2nd Edition, 1996.
Farhi et al., "Quantum Adiabatic Evolution Algorithms versus Simulated Annealing," MIT-CTP #3228, arXiv:quant-ph/0201031 v1, pp. 1-16, Jan. 8, 2002.
Feynman, "Simulating Physics with Computers," International Journal of Theoretical Physics 21(6/7): 467-488, 1982.
Friedman et al., "Quantum superposition of distinct macroscopic states," Nature 406:43-46, Jul. 6, 2000.
Il'ichev et al., "Continuous Monitoring of Rabi Oscillations in a Josephson Flux Qubit," Physical Review Letters 91(9): 097906-1-097906-4, week ending Aug. 29, 2003.
Krenner et al., "Recent advances in exciton-based quantum information processing in quantum dot nanostructures", New Journal of Physics, Aug. 26, 2005.
Maasen van den Brink et al., "Mediated Tunable Coupling of Flux Qubits," New Journal of Physics 7(230) 2005, 19 pages.
Makhlin et al., "Quantum-state engineering with Josephson-junction devices," Reviews of Modern Physics 73(2):357-400, Apr. 2001.
Mooij et al., "Josephson Persistent-Current Qubit," Science 285:1036-1039, Aug. 13, 1999.
Nielsen et al., Quantum Computation and Quantum Information, Cambridge University Press, Cambridge, 2000, "7.8 Other implementation schemes," pp. 343-345.
Orlando et al., "Superconducting persistent-current qubit," Physical Review B 60(22):15398-15413, Dec. 1, 1999.
Shor, "Introduction to Quantum Algorithms," AT&T Labs—Research, arXiv:quant-ph/0005003 v2, pp. 1-17, Jul. 6, 2001.
T. Miyazaki, S. Yorozu, M. Maezawam M. Hidaka, J-S Tsai, "Development of SFQ Multi-Chip Modules for Quantum Bits", IEEE Transactions on Applied Superconductivity, Jun. 2007.
T. Ogashiwa et al., "Flip-Chip Bonding Using Superconducting Solder Bump", Jpn. J. Appl. Phys., Aug. 1995.
T. P. Spiller, I. D'Amico & B. W. Lovett, "Entanglement distribution for a practical quantum-dot-based quantum processor architecture", New Journal of Physics, Jan. 29, 2007.
Yokoyama et al., "Robust Superconducting Die Attach Process", IEEE Transactions on Applied Superconductivity, Jun. 1997.
International Search Report and Written Opinion dated Apr. 5, 2018, for PCT/US2017/065152 in 10 pages.
Chinese Office Action dated Jan. 5, 2022 for Chinese Application No. 201780076119.9 in 10 pages (translation of action).
Non-Final Office Action issued in U.S. Appl. No. 16/896,554, dated Aug. 11, 2022, 2021, 8 pages.
PubChem Sodium 4-hydroxybenzenesulfonate (Compound)URL: https://pubchem.ncbi.nlm.nih.gov, Sep. 14, 2005, 22 pages.

\* cited by examiner

SUPERCONDUCTING PRINTED CIRCUIT BOARD RELATED SYSTEMS, METHODS, AND APPARATUS

FIELD

The present systems, methods, and apparatus generally relate to the realization of superconducting circuits on multilayer superconducting printed circuit boards.

BACKGROUND

Description of the Related Art

Since they were first introduced around the time of World War II, conventional printed circuit boards ("PCBs") have simultaneously reduced in size and grown in sophistication. An important step in this evolution was the introduction of conductive vias to provide electrical communication between separate layers of a PCB. In non-superconducting applications, multilayer PCBs (i.e., PCBs with two or more layers of conductive traces) have been used for decades. However, several challenges that are inherent in non-superconducting electronics (e.g., power consumption and heat dissipation) continue to influence each stage of development of these devices and, ultimately, may limit the capabilities of non-superconducting PCB technology.

Superconducting technology can offer many advantages over conventional, non-superconducting electronics. Superconductors operate in a regime of little to no electrical resistance, and therefore do not generate heat to the same extent as conventional non-superconducting devices. Furthermore, superconducting devices can achieve very high operational speeds. Many of the challenges that continue to plague conventional non-superconducting electronics technology may be overcome or circumvented by a conversion to superconducting technology. Superconducting circuits using single-layer or double-layer PCBs have been described. Superconducting connections provided to internal layers of a multilayer circuit board structure, for example by superconducting vias, are described in U.S. Pat. No. 8,315,678 ("Systems, Methods, and Apparatus for Multilayer Superconducting Printed Circuit Boards"). A via (also referred to in the present application as a vertical interconnect access) is an electrical connection between layers in a physical electronic circuit (such as a multilayer PCB) that goes through the plane of one or more adjacent layers. In one implementation, a via includes a through-hole. A superconducting via is a superconducting electrical connection between layers in a physical electronic circuit (such as a multilayer superconducting PCB) that goes through the plane of one or more adjacent layers.

BRIEF SUMMARY

A method of fabricating a multilayer superconducting printed circuit board may be summarized as including forming a first set of holes in a first electrically insulative substrate having a first surface and a second surface, the second surface opposed to the first surface across a thickness of the first electrically insulative substrate, each hole of the first set of holes forming a respective channel between the first surface and the second surface; forming a first panel by depositing a first bimetal foil to overlie at least a first portion of the first electrically insulative substrate; forming a second set of holes in a second electrically insulative substrate having a third surface and a fourth surface, the fourth surface opposed to the third surface across a thickness of the second electrically insulative substrate, each hole of the second set of holes forming a respective channel between the third surface and the fourth surface; forming a second panel by depositing a second bimetal foil to overlie at least a second portion of the second electrically insulative substrate, wherein the first and the second bimetal foils each comprise a first metal that is non-superconductive in a range of temperatures and a second metal that is superconductive in the range of temperatures; patterning a first side of the first panel to form one or more exposed traces of the second metal on the first side of the first panel; patterning a second side of the second panel to form one or more exposed traces of the second metal on the second side of the second panel; plating the first and the second panel to deposit a third metal on at least one of the one or more exposed traces of the second metal to form one or more traces of the second metal plated with the third metal, wherein the third metal is superconductive in the range of temperatures; and joining the first and the second panels to form at least a three-layer superconducting printed circuit board comprising an inner layer, two outer layers, and one or more superconducting vias providing a superconductive electrical coupling between the inner layer and at least one of the two outer layers.

Depositing a first bimetal foil to overlie at least a first portion of the first electrically insulative substrate may include depositing a first bimetal foil wherein the first metal includes copper, and depositing a second bimetal foil to overlie at least a second portion of the second electrically insulative substrate may include depositing a second bimetal foil wherein the first metal comprises copper.

Forming a first panel by depositing a first bimetal foil to overlie at least a first portion of the first electrically insulative substrate may include at least partially copper-plating the first electrically insulative substrate to form a first copper-plated substrate; depositing a superconducting metal on at least part of the first copper-plated substrate to form a first superconductive substrate; and at least partially copper-plating the first superconductive substrate to form the first panel; and forming a second panel by depositing a second bimetal foil to overlie at least a second portion of the second electrically insulative substrate may include at least partially copper-plating the second electrically insulative substrate to form a second copper-plated substrate; depositing a superconducting metal on at least part of the second copper-plated substrate to form a second superconductive substrate; and at least partially copper-plating the second superconductive substrate to form the second panel. Plating the first and the second panel to deposit a third metal on at least one of the one or more exposed traces of the second metal to form one or more traces of the second metal plated with the third metal may include tin-plating the first and the second panel to deposit tin on at least one of the one or more exposed traces of the second metal to form one or more tin-plated traces. Joining the first and the second panels may include positioning the first side of the first panel adjacent to the second side of the second panel, to establish electrical contact between at least one of the tin-plated traces on the first side of the first panel with at least one of the tin-plated traces on the second side of the second panel. Patterning a first side of the first panel to form one or more exposed traces of the first metal on the first side of the first panel may include removing a portion of the second metal overlying the first metal on the first side of the first panel, and patterning a second side of the second panel to form one or more exposed traces of the first metal on the second side of the second panel may include removing a portion of the second metal overlying the first metal on the second side of the second panel. Forming a first set of holes in a first electrically insulative substrate may include drilling a first set of holes in a first electrically insulative substrate, and forming a second set of holes in a second electrically insulative substrate may include drilling a second set of holes in a second electrically insulative substrate.

The first and the second electrically insulative substrate may include partially-cured pre-preg, and joining the first and the second panels may further include curing of the partially-cured pre-preg. Depositing a first bimetal foil to overlie at least a first portion of the first electrically insulative substrate may include depositing a first bimetal foil wherein the second metal comprises aluminum, and depositing a second bimetal foil to overlie at least a second portion of the second electrically insulative substrate may include depositing a second bimetal foil wherein the second metal comprises aluminum.

Forming a first panel by depositing a first bimetal foil to overlie at least a first portion of the first electrically insulative substrate may include at least partially copper-plating the first electrically insulative substrate to form a first copper-plated substrate; at least partially aluminum-plating the first copper-plated substrate to form a first aluminum-plated substrate; and at least partially copper-plating the first aluminum-plated substrate to form the first panel; and forming a second panel by depositing a second bimetal foil to overlie at least a second portion of the second electrically insulative substrate may include at least partially copper-plating the second electrically insulative substrate to form a second copper-plated substrate; at least partially aluminum-plating the second copper-plated substrate to form a second aluminum-plated substrate; and at least partially copper-plating the second aluminum-plated substrate to form the second panel. Plating the first and the second panel to deposit a third metal on at least one of the one or more exposed traces of the first metal to form one or more traces of the first metal plated with the third metal may include tin-plating the first and the second panel to deposit tin on at least one of the one or more exposed aluminum traces to form one or more tin-plated aluminum traces. Joining the first and the second panels may include positioning the first side of the first panel adjacent to the second side of the second panel, and establishing electrical contact between at least one of the tin-plated aluminum traces on the first side of the first panel with at least one of the tin-plated aluminum traces on the second side of the second panel. Joining the first and the second panels may include laminating the first and the second panels.

A multilayer superconducting printed circuit board may be summarized as including a first electrically insulative substrate having a first surface and a second surface, the second surface opposed to the first surface across a thickness of the first electrically insulative substrate; a first set of holes in the first electrically insulative substrate, each hole of the first set of holes forming a respective channel between the first surface and the second surface; a first bimetal foil overlying at least a first portion of the first electrically insulative substrate to form a first panel; a second electrically insulative substrate having a third surface and a fourth surface, the fourth surface opposed to the third surface across a thickness of the second electrically insulative substrate; a second set of holes in the second electrically insulative substrate, each hole of the second set of holes forming a respective channel between the third surface and the fourth surface; a second bimetal foil overlying at least a second portion of the second electrically insulative substrate to form a second panel, wherein the first and the second bimetal foils each include a first metal that is non-superconductive in a range of temperatures and a second metal that is superconductive in the range of temperatures, a first side of the first panel includes one or more exposed traces of the second metal, a second side of the second panel includes one or more exposed traces of the second metal on the second side of the second panel; and a third metal overlying at least one of the one or more exposed traces of the second metal on the first and the second panel, and the third metal is superconductive in the range of temperatures, wherein the first and the second panel form at least a three-layer superconducting printed circuit board including an inner layer, two outer layers, and one or more superconducting vias providing a superconductive electrical coupling between the inner layer and at least one of the two outer layers.

A multilayer superconducting printed circuit board may be summarized as including a first panel, the first panel including a first electrically insulative substrate, the first electrically insulative substrate including a first through-hole; a first bimetal foil overlying at least a portion of the first electrically insulative substrate; and a first plurality of traces patterned in the first bimetal foil on an inner side of the first panel; a second panel, the second panel including a second electrically insulative substrate, the second electrically insulative substrate comprising a second through-hole; a second bimetal foil overlying at least a portion of the second electrically insulative substrate; and a second plurality of traces patterned in the second bimetal foil on an inner side of the second panel; and a metal that is superconductive in a range of temperatures between the inner side of the first panel and the inner side of the second panel, wherein at least one of the first plurality of traces is superconductingly electrically communicatively coupled to at least one of the second plurality of traces by the metal that is superconductive in the range of temperatures. At least one of the first and the second electrically insulative substrate may include polyimide. At least one of the first and the second through-hole may be a drilled hole. Each of the first and the second bimetal foil may include a respective first instance of a first metal overlying the first electrically insulative substrate, where the first metal is non-superconductive in the range of temperatures; a respective instance of a second metal overlying the first instance of the first metal, where the second metal is different from the first metal, and the second metal is superconductive in the range of temperatures.

Each of the first and the second bimetal foil may further include a respective second instance of the first metal overlying the instance of the second metal. The first metal may be copper, and the second metal may be a metal selected from the group consisting of aluminum, lead, tin, and niobium.

The multilayer superconducting printed circuit board may further include a third plurality of traces patterned in the first bimetal foil on an outer side of the first panel; and a fourth plurality of traces patterned in the second bimetal foil on an outer side of the second panel. At least one trace of the third and the fourth plurality of traces may be superconductingly electrically communicatively coupled to at least one trace of the first and the second plurality of traces in the range of temperatures.

A multilayer superconducting printed circuit board may be summarized as including a first panel comprising an inner side and an outer side, the inner side of the first panel patterned with a first plurality of traces, and the outer side of the first panel patterned with a second plurality of traces, each trace of the first and the second plurality of traces comprising a metal that is superconductive in a range of temperatures; a second panel comprising an inner side and an outer side, the inner side of the second panel patterned with a third plurality of traces, and the outer side of the second panel patterned with a fourth plurality of traces, each trace of the third and the fourth plurality of traces comprising a metal that is superconductive in the range of temperatures, the second panel joined to the first panel; and a communication path that is superconductive in the range of temperatures, wherein one trace of the first plurality of traces is electrically communicatively coupled to at least one trace of the second, third, and the fourth plurality of traces by the communication path.

A multilayer superconducting printed circuit board may be summarized as including a first panel; a second panel joined to the first panel to form a laminate, the second panel superconductingly electrically coupled to the first panel by a metal that is superconductive in a range of temperatures; an inner layer formed between the first and the second panel, the inner layer comprising a first plurality of traces; an outer layer comprising a second plurality of traces; and a superconducting via superconductingly electrically communicatively coupled to a trace in the first plurality of traces and a trace in the second plurality of traces.

A multilayer superconducting printed circuit board may be summarized as including a first panel comprising a first outer side and a first inner side; a second panel comprising a second outer side and a second inner side, the second inner side joined to the first inner side to form a laminate; a first superconducting via comprising a first through-hole in the first panel and a superconductive material at least partially filling the first through-hole, the superconductive material of the first superconducting via superconductive in a range of temperatures; a second superconducting via comprising a second through-hole in the second panel and a superconductive material at least partially filling the second through-hole, the superconductive material of the second superconducting via superconductive in the range of temperatures; a first superconducting trace on the first inner side, the first superconducting trace superconductive in the range of temperatures; a second superconducting trace on the second inner side, the second superconducting trace superconductive in the range of temperatures; and a superconductive metal superconductive in the range of temperatures, wherein a trace on the first outer side is superconductingly electrically communicatively coupled to a trace on the second outer side by a communication path comprising the first superconducting via, the first superconducting trace, the superconductive coating of metal, the second superconducting trace, and the second superconducting via.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

FIG. 1 is a cross-sectional view of a portion of a multilayer superconducting printed circuit board that provides inter-layer superconducting communication through a superconducting via, according to one illustrated implementation of the present disclosure.

FIGS. 2A, 2B, 2C, 2D, and 2E are cross-sectional views of a multilayer printed circuit board (PCB) at different stages of a fabrication process, according to one illustrated implementation of the present disclosure.

DETAILED DESCRIPTION

Figure 1:
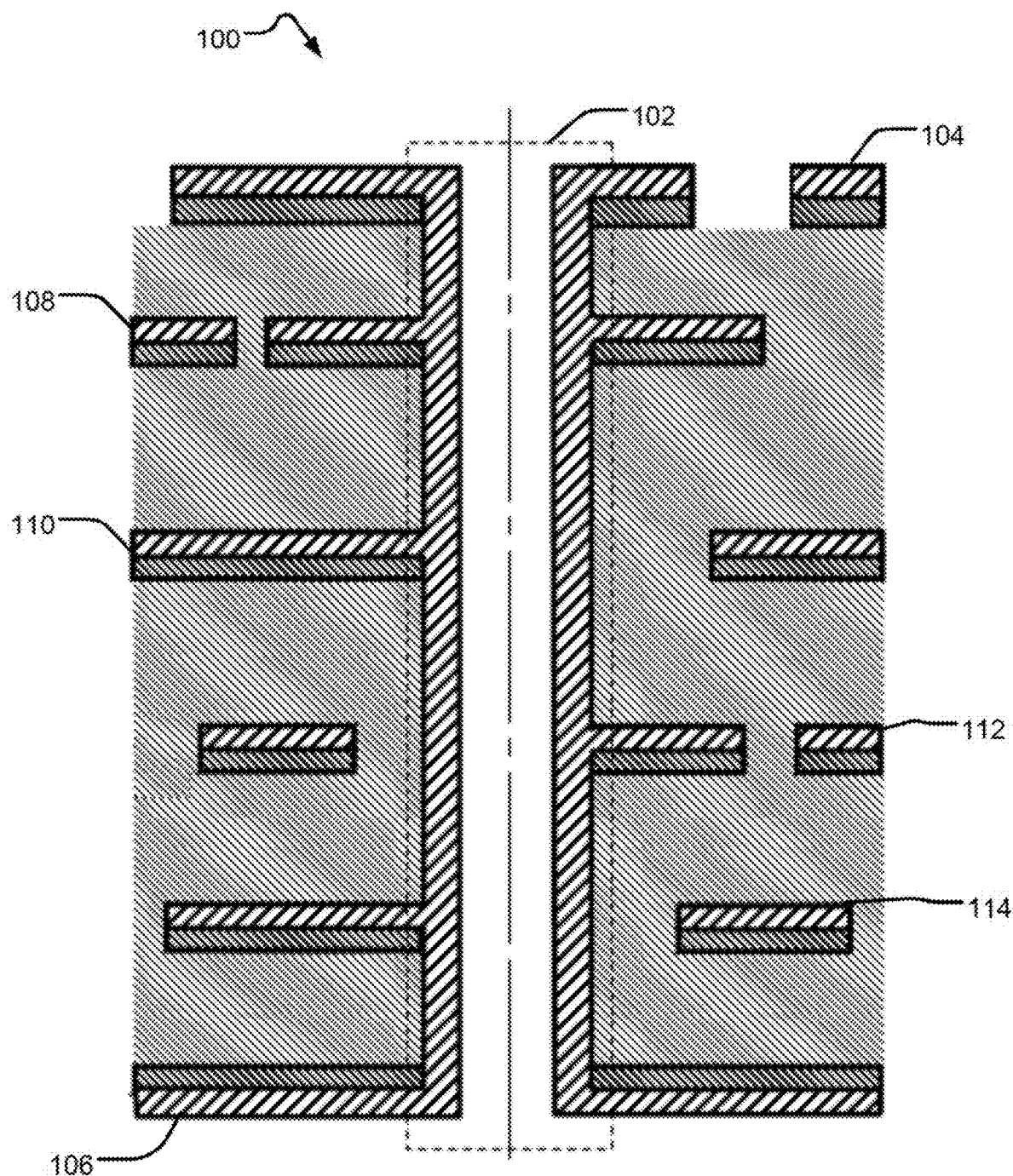

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with printed circuit boards, superconducting circuits, devices and control systems including microprocessors and drive circuitry have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

The present systems, methods and apparatus describe multilayer superconducting printed circuit boards ("PCBs") that include superconducting communication between at least two of the layers through at least one superconducting via, where at least one of the layers is an inner layer, not physically accessible from an exterior of the substrate structure except by a via, through-hole or other opening. Accordingly, the present systems, methods and apparatus describe multilayer superconducting PCBs that benefit from inter-layer superconducting communication paths. Such devices represent an important advancement in the field of superconductivity as they facilitate the development of more sophisticated superconducting circuits.

Throughout this specification and the appended claims, the terms "insulative material", "insulative medium" and "insulative substrate" are used interchangeably to describe an electrically insulative substrate which electrically insulates conductive or superconductive current paths from one another. The electrically insulative material may be, for example, a polyimide (e.g., Kapton®), AD1000, and/or a suitable PTFE composite. The electrically insulative material may be provided as a substrate layer having opposed surfaces which may serve as a physical structure surface upon which the conducting and/or superconducting paths of the circuit may be carried. The superconductive paths may be plated (e.g., by hot air solder leveling) or otherwise deposited, printed or formed using various techniques.

In a multilayer PCB, multiple substrate layers of electrically insulative material may be sandwiched together to physically separate, and electrically insulate, various levels of current paths from one another. This may be accomplished by plating or otherwise depositing, coating, printing or forming conductive current paths on the top and/or bottom surfaces or faces of at least two substrate layers, and then sandwiching at least two layers together. In some implementations, the multilayer PCB can include an interface or intermediary layer or intermediate substrate between two substrate layers that separates two inner layers of conductive current paths.

There is generally an even number of conductive layers in a multilayer PCB. One way to produce a multilayer PCB with an odd number of conductive layers is to delete the metal from one or more layers of an even-layer build.

Alternatively, the substrate structure may be built up "insulative substrate layer by insulative substrate layer", sequentially depositing electrically insulative material, conductive material and/or superconductive material to form the various layers. Drilling, etching or other techniques may be used to form one or more vias extending all, or partially, through one or more of the substrate layers.

Conductive current paths are commonly known as "traces", and are typically made of a conductive metal, such as copper. In some designs, the surfaces of the insulating material or substrate layers may first be coated with a sparse layer of binding material, such as palladium or graphite, which allows the conductive traces to physically bind to the insulating medium. Copper metal is typically used for the conductive traces. Throughout the remainder of this specification, the term "normal non-superconducting metal" is used to describe a conductive material, path or trace that is not superconducting at typical superconducting temperatures. Those of skill in the art will appreciate that the term "normal non-superconducting metal" may include pure elemental metals as well as metallic alloys. Also, throughout this specification and the appended claims, the term "superconducting" when used to describe a physical structure such as a "superconducting current path" is used to indicate a material that behaves as a superconductor when operated at an appropriate temperature. A superconducting material (such as a metal or metallic alloy) is superconductive in a range of temperatures. A superconductive material is generally superconductive below a characteristic temperature also referred to in the present application as a critical temperature. For example, the critical temperature of aluminum is 1.2 K. The critical temperature of tin is 3.7 K. A superconductor material may not necessarily be acting as a superconductor at all times in all embodiments of the present systems, methods and apparatus. An embodiment of the present systems, methods and apparatus may be operated at a temperature in a range of temperatures at which a constituent material is superconductive.

A superconducting PCB may be fabricated by laying out the conductive traces of the circuit with normal non-superconducting metal, such as copper, and then plating or otherwise depositing or forming a superconducting metal (e.g., tin or lead) on the normal non-superconducting metal. The conductive traces may be deposited or otherwise formed on at least one surface or face of an insulative medium. In some implementations, a sparse layer of a binding material, such as palladium or graphite, may be included to help bind the conductive traces to the insulative medium. Multiple conductive layers may be separated by respective layers of the same insulative medium.

Superconducting communication between the two outer layers of a superconducting PCB can be achieved using a superconductor-plated through-hole. In one implementation, this can be done by forming (e.g., drilling, etching) a hole through the PCB, coating the hole with a binding agent such as palladium or graphite, plating the hole with a normal non-superconducting metal, and then plating the normal non-superconducting metal with a superconducting metal.

Applications of such superconductor-plated through-holes are described in U.S. Pat. No. 8,441,329 entitled "Input/Output Systems and Devices for Use with Superconducting Based Computing Systems", and U.S. Pat. No. 8,008,991 entitled "Systems, Methods and Apparatus for Electrical Filters".

Using the method described above, the PCB only provides superconducting connections between the two outer surfaces of a PCB. A limitation of the method described above is that the superconductor-plated through-hole does not establish a superconducting communication path between an outer layer and an inner layer of the superconducting PCB.

In another method, a through-hole can be drilled right through a PCB, and, according to common practice, plated with a non-superconducting metal such as, for example, copper, before being plated with a superconducting metal such as, for example, tin or lead, or an alloy such as, for example, tin-lead. In some embodiments, a layer of palladium or graphite (not shown) may be used to bind the copper to the insulative medium.

This technique may provide superconducting communication between outer layers of the PCB. The inner layers of the PCB, however, are not superconductingly electrically coupled to such superconducting inter-communication. This is because copper, while a good conductor at room temperature, is not superconducting when the system is cooled to the superconducting regime, unlike tin for example. A layer of non-superconducting metal such as copper separates the superconducting inner layers from the superconductor-plating on through-hole. Thus, the superconductor-plated through-hole technique as described above does not provide superconducting communication with the inner layers in a multilayer PCB, and it is at least partly because of this that multilayer superconducting PCBs have not been used to date.

The present systems, methods and apparatus describe multilayer, multi-metal PCBs, and the fabrication thereof, including methods for adding or removing one metal in the presence of another. The acts or operations described in the present application can be combined in suitable ways to fabricate complex multilayer PCBs according to specific requirements.

The present systems, methods and apparatus describe multilayer superconducting PCBs that include superconducting communication between at least one inner superconducting layer and another superconducting layer in the PCB. This inter-layer superconducting communication may be accomplished through superconducting vias.

One way to fabricate a multilayer PCB having a superconducting path between an inner layer and an outer layer is to build two or more two-layer PCBs with superconducting traces and vias, and bond them together in a multilayer stack. The superconducting traces and vias may include aluminum, for example. Through-holes can be drilled after the layers are bonded, and can be plated through to facilitate connections between layers. Interlayer connections can be made by a soldering of wires or metal braids through the holes, laser ablation and wirebonding, or another suitable method.

FIG. 1 is a cross-sectional view of a portion of a multilayer superconducting PCB 100 that provides inter-layer superconducting communication through a superconducting via 102. Multilayer superconducting PCB 100 includes two outer superconducting layers 104 and 106 (top and bottom, respectively) and four inner superconducting layers 108, 110, 112, and 114.

Superconducting via 102 extends through PCB 100, however those of skill in the art will appreciate that superconducting via 102 may extend only part way through PCB 100 depending on the layout of the superconducting traces in PCB 100. Via 102 may be formed in a variety of ways, for example mechanical drilling, laser drilling, etching, etc.

As an alternative technique for fabricating a superconducting trace (as opposed to plating a non-superconducting metal with a superconducting metal), in some embodiments, a superconducting trace may be laid or carried upon a surface of the insulative medium. For instance, the conductive traces of a superconducting circuit may be laid out with a superconducting metal, such as niobium, to overlie a surface of the insulative medium without an intervening layer of non-superconducting metal. Some such embodiments may also include a layer of binding material, such as palladium or graphite, to help bind the superconducting metal to the insulative medium.

Superconducting via 102 differs from the superconductor-plated through-hole described earlier in that superconducting via 102 is not plated with a non-superconducting metal, such as copper. In some embodiments, the walls of superconducting via 102 are plated with a superconducting metal which is not plated onto the surface of a non-superconducting metal. A sparse layer of binding material, such as palladium (not shown), may be used to bind the superconducting metal to the insulative medium. The omission of the non-superconducting plating, for instance the copper plating, from the process of fabricating superconducting via 102 allows superconducting connections to be formed between the walls of superconducting via 102 and the inner superconducting layers 108, 110, 112, and 114, and thereby allows the fabrication of improved multilayer superconducting PCBs.

In embodiments that include a sparse layer of binding material, such as palladium, superconducting connections between the via and inner layers of the PCB can be made if the binding material is itself superconducting or if the layer is sufficiently sparse, for example. PCB 100 in FIG. 1 has established superconducting communication between portions of all layers.

Those of skill in the art will appreciate that both the layout of superconducting layers 104, 106, 108, 110, 112, and 114 shown in FIG. 1 and the number of superconducting layers used are meant to serve only as examples. The present systems, methods and apparatus may be applied to any multilayer superconducting PCB configuration. Those of skill in the art will appreciate that a given multilayer superconducting PCB may use any number of superconducting vias to communicate superconductingly between layers.

Further description of the above method can be found in U.S. Pat. No. 8,315,678 entitled "Systems, Methods, and Apparatus for Multilayer Superconducting Printed Circuit Boards".

In some implementations, as mentioned above, superconducting via 102 may extend only part-way through PCB 100, and is also referred to in the present application as a blind superconducting via. In other implementations, a superconducting via (such as superconducting via 102) may be completely contained within PCB 100 and not visible from the surface. This type of via is also referred to in the present application as a buried superconducting via. In some implementations, it may be more practical to drill holes or passages for a blind superconducting via or a buried superconducting via such that they extend right through PCB 100. An advantage of this approach can be lower costs and a simpler fabrication process. In such implementations, the layouts of the superconducting traces on each layer of a multilayer superconducting PCB may be arranged to accommodate holes or gaps in each layer as required.

Fabrication of an Aluminum PCB
Building the Simple Core for a Multilayer PCB

The core for a multilayer PCB can be fabricated from a commercially available core with no copper cladding. Alternatively, the core for a multilayer PCB can be fabricated from a commercially available copper-clad PCB core by removing the copper. In both cases, the core can be selected to have a desired thickness. The dielectric material of the core can be a polyimide (e.g., Kapton®), AD1000, and/or a suitable PTFE composite. In some multilayer PCBs, the core includes only one type of dielectric material. In other multilayer PCBs, the core includes more than one type of dielectric material. The choice of dielectric(s) can be based, at least in part, on the required temperature resistance, and the required level of dissipation for the PCB being fabricated.

The PCB stack-up can be arranged on the unclad core. In one implementation, bimetal foil is used, and the stack-up is as follows: bimetal foil (Cu/Al/Cu), pre-preg, core, pre-preg, bimetal foil (Cu/Al/Cu). The stack-up can be heat-pressed, and baked, to form a bimetal-foil-clad core.

Suitable bimetal foils include bimetal foils made by Metfoil (Sweden) and Hanita Coatings (Israel). Pre-preg is a woven fiberglass cloth impregnated with a partially-cured resin, and can be used as a glue or bonding agent. A suitable pre-preg can be selected based, at least in part, on its curing characteristics including temperature, curing time, and pressure. The pre-preg characteristics can be tuned to improve its adhesion to aluminum or copper, for example. The pre-preg characteristics can also be tuned to achieve a desired final thickness of the bimetal-foil-clad core.

The stack-up can be varied to suit the requirements of the PCB being fabricated, including a desired thickness and number of metal layers. For example, in one implementation, the stack-up is as follows: bimetal foil (Cu/Al/Cu), pre-preg, bimetal-foil-clad core, pre-preg, bimetal foil (Cu/Al/Cu), where the bimetal-foil-clad core has a stack-up as described in an earlier paragraph. In another implementation, the stack-up is as follows: bimetal foil (Cu/Al/Cu), pre-preg, core, pre-preg, bimetal-foil-clad core, pre-preg, core, pre-preg, bimetal foil (Cu/Al/Cu).

The bimetal foil in these and other stack-ups can be replaced by simple copper foil. A simple aluminum, or an Al/Cu foil, can be used provided there is sufficient adhesion between the aluminum and the pre-preg. Surface modifications can be made to improve the adhesion between the aluminum and the pre-preg. In some implementations, a metal layer can be omitted, and two pre-preg layers can be placed adjacent to one another, for example to achieve a desired, or non-standard, thickness.

Pre-preg can be replaced in the stack-up by other adhesives such as, for example, heat-cured, humidity-cured, or time-cured adhesives. Double-sided tape can be used in place of pre-preg.

Building the Inner-layer-patterned Core for a Multilayer PCB

Each of the metal layers in the core can be patterned into aluminum circuits after lamination, and while the metal is still exposed. Top and bottom metal layers can be patterned. Cores with patterned metal can be combined with other patterned or non-patterned cores. A non-patterned core is a core with unpatterned metal.

Alignment of the patterns can be achieved by drilling reference holes, or other mechanical features, in the core. The reference holes can be mechanically aligned when the stack is assembled, and held in place ready for heat-pressing. Another way to align the patterns is to leave areas free of metal during patterning. Since the dielectric can be semi-transparent when it is sufficiently thin, alignment can be achieved by backlighting the dielectric. Other suitable methods of alignment can be used, for example X-ray or acoustic methods.

In some implementations, patterning includes patterning areas of metal that may not be electrically active to make a less-dense pattern, and to adjust the final thickness of the multilayer PCB. One or more patterned cores in the laminated multilayer PCB can be cores without aluminum metal.

Outer-layer-patterned Core

After completing a simple core or an inner-layer-patterned core for a multilayer PCB, the fabrication method can include patterning the top and/or bottom, outer layer of metal.

Copper patterning of the exposed (top) layer of copper in the Cu/Al/Cu foil can follow a conventional process that uses a suitable chemistry. Patterning can include applying a suitable resist material to prevent chemical etching in areas where copper is to remain.

Aluminum patterning can follow a process that uses a basic solution of potassium hydroxide (KOH) or sodium hydroxide (NaOH) to etch the aluminum. It is generally the case that most photoresists are unable to withstand KOH or NaOH, both of which can be used in other applications to remove a photoresist. One approach is to use the outer layer of copper in the Cu/Al/Cu foil as an etch resist. The method can include applying a suitable copper-compatible photoresist over the copper, and lithographically exposing the photoresist. After curing, and/or another suitable process to make the photoresist more durable, the method can include using a suitable copper-compatible etchant to remove copper, and expose bare aluminum, the etchant selected to preferentially remove copper rather than etching aluminum or creating a galvanically-enhanced etch of the copper-aluminum interface. For example, cyclo-etch FT-2 copper microetch from Electrochemicals Inc. can be a suitable choice of etchant. If the etchant is acidic, or contains hydrogen peroxide, it can cause an exposed aluminum surface to oxidize.

A PCB mill can be used to perform patterning of aluminum, copper and/or a bimetal foil.

Galvanic corrosion can accelerate chemical etching, and, with some etchants, can cause etching of an Al/Cu interface at a rate that can be at least an order of magnitude greater than the etching of either a copper layer on its own or an aluminum layer on its own. Galvanic corrosion can cause delamination of metal layers. In addition, etch rate can vary with the duration of the etch, the temperature of the etch, and the concentration of the etchant. Galvanic corrosion can be complicated by the presence of zinc at the Al/Cu interface which can be present if fabrication of the Cu/Al/Cu foil includes electroplating of copper onto aluminum where the aluminum surface is first zincated.

Sodium nitrate (or nitrite), or potassium nitrate (or nitrite), can be used to limit galvanic corrosion. See for example U.S. Pat. No. 3,859,149.

Using the copper as an etch resist, the fabrication method can include removing aluminum to define traces on the PCB. The etch can be performed until the copper layer under the aluminum layer is exposed. If the aluminum is clad directly to the pre-preg (rather than to a copper layer), then the etch can be performed until the pre-preg is exposed.

Etching can undercut the aluminum under the top layer of copper (the layer of copper being used as an etch resist). Consequently, the width of the aluminum traces can be limited by the thickness of the aluminum layer. The fabrication method can reduce the amount of undercut by using a thinner aluminum foil.

After etching, the aluminum traces can have a trapezoidal, or triangular, cross-section with sloped sidewalls. A trapezoidal cross-section is desirable for making wirebond pads, whereas a triangular cross-section can be suitable for electrically-conductive traces.

During etching of the aluminum, chemical species can be consumed, and the ratios can move away from preferred values. Consequently, galvanic corrosion of the interface can accelerate in localized regions to cause "mousebites" which alone, or in combination, can cause a trace to be broken.

Additionally, the etch process can liberate hydrogen gas which can retard etching, or otherwise disturb the contact between etchant and metal. Typically, an etch-sprayer can be used to deliver etchant to the surface of the PCB in a spray. The spray can be applied under pressure, and directed at the PCB from the side, a technique that allows evolved gas to float away, or be washed away. An etch-sprayer can be used to control etch time and temperature. Some etch-sprayers can handle concentrated NaOH or KOH.

Patterning the Copper Layer Under the Aluminum of a Cu/Al/Cu Foil

The bottom layer of copper in the Cu/Al/Cu foil can be removed to electrically disconnect the aluminum traces. Typically, the copper can be removed using the same type of etchant as one used in the copper patterning operation described above. One approach is to remove all, or least most, of the bottom layer of copper. In so doing, the etchant can also remove the copper above the aluminum which was used as the etch resist for the aluminum etchant. The result is a set of aluminum traces where the exposed metal is aluminum.

Another approach is to apply photoresist on either or both of the copper layers, and leave at least some copper on the aluminum (either above the aluminum, or below it, or both). An advantage of leaving copper on the aluminum is to have a surface to which a solder connection can be easier to make. Provided the copper is a small patch surrounded by exposed aluminum, a superconductive solder connection can be made to the aluminum by allowing the solder to extend beyond the copper patch.

Another advantage of leaving some copper on the aluminum is that it can help reduce "hot spots" by conducting heat away. When superconductive, aluminum is a poor thermal conductor. Yet another advantage of leaving copper on the aluminum when creating an inner layer is that PCB adhesives typically provide better adhesion to copper than aluminum. Yet another advantage is that the copper surface (and mousebites described above) may be more visible under a microscope than aluminum when the traces are covered with a solder mask.

Constructing Vias

Typically, vias in PCBs can be constructed by drilling holes through the PCB, activating them by modifying the surface to make it suitable for electroplating, and then plating the surface, the surface including at least some of the inner surface of the drilled holes. After the vias have been constructed, the holes can be masked while the surface of the PCB is patterned.

Constructing Aluminum Vias

One challenge with constructing superconducting vias is that aluminum can be more difficult to plate than copper, for example. Existing approaches using electroplating have shortcomings related to aspects of the process that can include the use of a high-temperature electrolyte, for example.

Depositing reactive metals, such as aluminum and aluminum alloys, by traditional electroplating techniques can present challenges because of the narrowness of the electrochemical window of aqueous electrolytes. Water starts to decompose, forming hydrogen and oxygen before the metals deposit.

Reactive metals can be electroplated in ionic liquids (such as those produced by BASF SE of Ludwigshafen, Germany). One drawback is that water at PPM (parts per million) levels can poison the process. This can be addressed by plating the entire PCB surface with a copper layer thick enough, and dense enough, to be impervious to water. Water present in the dielectric is less likely to leak into the ionic solution. The surface of the copper should preferably be clean and dry before introducing the copper into the ionic liquid, which is itself protected from ambient humidity in the atmosphere. One advantage of ionic liquids is that the electroplating can be done at room temperature.

Other methods suitable for depositing aluminum can also be used. Those of skill in the art will appreciate that there are other methods of depositing aluminum (and other reactive metals and alloys) on substrates, such as evaporation, sputtering, chemical vapor deposition, and other suitable methods.

The systems and methods described in this application include an aluminum-plating process that overcomes the shortcomings of existing electroplating methods.

Since a typical PCB copper-plating solution may not be effective at plating copper onto an aluminum surface, the process can include the application of a zinc adhesion layer as described above. Alternatively, or in addition, the process can include anodizing, or otherwise passivating, the aluminum before copper-plating it.

The above described systems and methods can produce a PCB that includes a Cu/Al/Cu structure that can be patterned, for example as previously described with reference to other implementations. If the process includes drilling or etching holes in the substrate, then the PCB can include vias with a Cu/Al/Cu structure on the inner surface of the holes or passages. The process can produce a PCB including vias that provide a superconductive electrical coupling between one layer of the PCB and the other outer layer.

The process can produce a PCB including vias that provide a low-resistance electrical coupling between an outer layer of the PCB and an inner layer. For example, the low-resistance electrical coupling can include a via having a resistance of less than 1 micro Ohm. The low-resistance electrical coupling includes an electrical path that can be superconductive over at least part of its length when the PCB is maintained at a temperature at which the aluminum in the PCB is superconducting.

Aluminum Vias Contacting Inner Layers

Drilling holes through a multilayer structure described above with Cu/Al/Cu foil, or with Cu/Al foil, can expose some of the aluminum. Typically, the exposed aluminum may not be compatible with standard activating solutions, and may not be compatible with standard PCB copper electroplating solutions. While the exposed aluminum can be passivated to make it more compatible, the passivated aluminum is generally not sufficiently electrically conductive to construct a via to an inner layer. As described above, a via (also referred to in the present application as a vertical interconnect access) is an electrical connection between layers in a physical electronic circuit (such as a multilayer PCB) that goes through the plane of one or more adjacent layers.

One approach is to pattern the inner layers, and etch aluminum away from areas containing a desired via location. As described above, the copper below the aluminum can be left at least partly intact. The patterned aluminum core can be patterned into inner layers in the structure, and holes can be drilled at one or more desired via locations. Since the aluminum has been etched away, the drilled holes generally expose only copper. Consequently, at least most of the exposed surface of structure is either dielectric or copper. Standard PCB technology can be used to activate the structure, and electroplate it with copper. The copper surface can be electroplated with aluminum, and then electroplated with copper, and the resulting Cu/Al/Cu foil can be patterned as described above.

Exposing Inner Aluminum

Non-superconductive electrical contact to inner layers can be provided by the via process described above. One way to establish superconductive contact is to expose metal by laser ablation through the dielectric. Aluminum metal will be exposed in places where copper has been etched away. Laser ablation is a suitable method because both copper and aluminum are optically reflective and thermally conductive, and the wavelength, power and duty cycle of the laser can be adjusted to preferentially remove dielectric, and stop at the metal surface.

For at least the same reason, laser ablation can produce a relatively clean metal surface. An aluminum surface exposed this way can be wirebonded with aluminum wire, and a superconductive connection can be made to a chip, for example. Laser ablation can also be used to make freehanging, or bridged, aluminum conductors which can be spot-welded, laser-welded, or ribbon-bonded.

One drawback of laser ablation is that residue from the decomposed, volatilized, or carbonized dielectric can be deposited on other surfaces of the structure. The result can be a slightly electrically-conductive film over the PCB which can be detrimental to performance. For example, the presence of the film can adversely affect the ability to wirebond to aluminum bonding pads on the PCB. One mitigation approach is to apply protective tape or photoresist before laser ablation to at least large portions of the area that will not be ablated. Alternatively, or in addition, oxygen plasma can be used after laser ablation to remove carbon residue.

Surface Modification of Aluminum to Enhance Soldering to Create Superconductive Connections Suitable solders and/or fluxes can be selected for soldering to aluminum, e.g. Superior 1260, and Indalloy #3. When cleaning flux off PCBs it can be desirable to use distilled water (or a pure solvent), and to change the cleaning fluid often to reduce the likelihood of accelerated etching at the copper/aluminum interface if the solvent becomes chemically reactive over time.

One approach is to coat the aluminum with tin. A drawback can be that the soldering temperature can cause the tin to melt, and expose the aluminum to oxidation.

Another approach is to "zincate" the aluminum since zinc is superconductive. A drawback is that zinc can dissolve into tin solder, and can raise the liquidus temperature. Additionally, zinc provides little or no protection of the aluminum from oxidation.

Other Notes

Photoresist applied directly on the aluminum can protect a wirebond pad from laser ablation residue, for example, but a photoresist stripper such as NaOH can etch the aluminum with which it comes into contact. The photoresist stripper can be used as a precursor to acetone.

Another approach is to use an aluminum-tinning process to passivate the aluminum, and make it more compatible with typical PCB processes where tin surfaces are used. The aluminum-tinning process can be a suitable immersion or electroplating process, for example.

Electroplated aluminum may have an advantage over the Metfoil aluminum, for example. Metfoil Cu/Al/Cu uses alloy 3003, selected for its ability to produce an aluminum foil strong enough to tolerate the manufacturing process. Alloy 3003 contains manganese and other metals, which may interfere with the NaOH etching process, and lead to a dark coating of unetched manganese on the aluminum. Though nitric acid can be used to remove the dark coating, it can interrupt the process flow, and introduce variability into the process. Manganese and/or other metals in alloy 3003 can make soldering more difficult. In some applications, electroplated aluminum is preferred for a cleaner etch and better solderability.

Electrodeposition of aluminum from room-temperature ionic liquids can be used as described below.

PCB-compatible Process for Superconducting Vias in a Multilayer Board

The following paragraphs describe a PCB-compatible process for forming superconducting vias in a 3-layer (three-layer) board. Those of skill in the art will appreciate that, in some embodiments and implementations, the PCB may have more than three layers, for example a multilayer PCB may have 4 (four) layers.

Stage 1: The first stage of the process is to make two separate cores, each using the approaches described above. The first stage can include the following acts:
  forming holes (e.g., drill, etch) in the respective substrate;
  activating and plating with copper to produce vias;
  copper-plating the activated board;
  plating or coating the copper surface with a superconductive metal (e.g., electroplating the copper with aluminum); and
  (optionally) copper-plating the superconducting metal.

The substrate can be an electrically insulative substrate, and the holes can be formed to provide a channel between two surfaces of the substrate across a thickness of the substrate. The output of stage 1 is two panels that can be mated, at a later stage, to form a 3-layer PCB. Copper-plating the board, then plating or coating the copper with a superconductive metal, and copper-plating the superconductive metal forms a bimetal foil (Cu/superconductive metal/Cu).

In one implementation, a panel is a single PCB. In another implementation, a panel is one or more layers of a PCB. In some implementations, a panel includes more than one PCB. In one example, a panel including more than one PCB is a rectangular board tab routed with a space between PCB boards and a border on four edges. In another example, a panel including more than one PCB includes rounded polygons. Panelization can help secure PCBs during manufacturing, shipping, and assembly.

Stage 2: The second stage of the process is to pattern one side of each panel thereby forming an inner layer of the 3-layer PCB. In some implementations, at least some of the vias on one of the two panels are aligned with corresponding vias on the other panel when the two panels are mated to form the 3-layer PCB. In other implementations, the vias are not aligned. When patterning the one side of each panel that will become the inner layer of the 3-layer PCB, the other side can be masked to prevent, or at least reduce, the exposure of the bimetal foil to the chemicals used in patterning.

In some implementations, vias can be filled, and sealed, with epoxy during this stage.

In some implementations, for example when the tin-plating process is electroplating, each future inner layer trace can be electrically connected to a metal plane on the respective future outer layer of the PCB. Electrically connecting each future inner layer trace to a metal plane on the respective future outer layer of the PCB can allow electroplating. In some implementations, after patterning and removal of copper, future inner layer traces can be at least substantially exposed superconducting metal only. Where the superconducting metal in the bimetal foil is aluminum, future inner layer traces can be at least substantially exposed aluminum only.

If the exposed superconducting metal is not tin, then the exposed superconducting metal on the future inner layer can be immersion-tinned or electroplated with tin. During this stage, the future outer layer can be protected, for example by using a mask, and can remain as copper.

The output of stage 2 is two panels, the future inner side of each panel patterned with traces of the superconducting metal coated with tin, each trace ending in a via that is electrically connected to an unpatterned bimetal foil surface on the respective future outer side.

Stage 3: The third stage of the process is to join or laminate the panels. The two panels produced in the processes described in stages 1 and 2 above are placed together with the two future inner sides facing each other, and the panels suitably aligned.

The joining or laminating process can include pressing the two panels together at a temperature sufficiently high to cause the tin on the surface to melt and fuse, thereby forming a superconducting connection (including the superconducting metal and/or tin) from a superconducting via on one panel to a corresponding superconducting via on the other panel.

In some implementations, it can be advantageous for vias not to be aligned. Blind vias can be useful, for example, in RF designs.

In some implementations, the process can create extended overlap between traces, rather than a single point of contact, as described with reference to FIG. 4 below. An advantage of extended overlap is that there can be greater opportunity for the tin to be fused sufficiently to form a superconductive connection and/or have sufficient mechanical strength.

It is desirable that the selected dielectric (in the core of the PCB) can tolerate temperatures at least up to the melting temperature of tin.

A flux can be used to modify the melting temperature of the tin on the PCB. A drawback of using a flux is that the flux can react at a later stage. In some implementations, the chamber in which the panels are being laminated can be flooded with a forming gas selected to enhance melting and fusing of the tin. The tin surface can be chemically prepared for fusing before contact, for example by stripping off an oxide, and activating the surface.

In some implementations, the inner sides of the panels can include copper patches suitably located. These patches can be soldered, and provide mechanical binding of the two panels. For example, a ground plane can include copper patches. In some implementations, the solder can connect multiple copper patches on a trace.

In some implementations, at least one outer layer of a multilayer PCB includes a ground plane. Vias described in the present application can provide electrical communicative coupling between a trace and a ground plane, and/or between two or more ground planes.

For vias that pass through both panels, that are aligned when pressed together, and that have an annular copper patch around the via, the process can include i) placing a solder ball onto the via, the solder ball larger than the diameter of the via; ii) aligning the panels to hold the solder ball captive between them; and iii) pressing the panels together at sufficiently high temperature to cause the solder ball to fuse to the copper. Though the connection made by the solder ball may not superconductive, it can provide a mechanical connection between the two panels, and at least help to hold them together in a 3-layer, or multilayer, PCB. This process is described with reference to FIGS. 2D and 2E below.

For vias that pass through both panels, that are aligned when pressed together, and that have tinned aluminum around the via, the process can form a superconducting connection between the via in one panel and a corresponding via in the other panel.

Selection of the solder can include selecting a solder that melts at a temperature high enough for the PCB to tolerate soldering of components to the PCB at a later stage. For example, pure tin melts at a higher temperature than lead-tin. If the superconducting metal in the bimetal foil is aluminum, then the presence of zinc on the aluminum (for example after zincating) can increase the temperature needed for lamination of the panels.

The melting temperature of pure tin is approximately 231° C., and a typical core such as Isola P96 Polyimide can have a glass temperature of approximately 260° C., and can tolerate temperatures as high as 288° C. for as long as 60 minutes. A benefit of operating near the glass temperature can be that the core can deform sufficiently to at least partially fill in the voids between at least some of the traces.

In one implementation, the panels can be laminated in a vacuum oven, thereby removing air before the stack is sealed. A vacuum may reduce oxidation of the tin before fusing. The vacuum oven may also be backfilled with a gas during lamination. For example, the vacuum oven may be backfilled with forming gas (a mixture of hydrogen gas and an inert gas such as nitrogen) during lamination. In some implementations, a vacuum oven may be used to suck epoxy into empty spaces, the epoxy being a compatible epoxy with low viscosity and a suitable curing temperature.

In some implementations, the melting point of the tin on the traces and the in-via solder balls (described above) can be selected such that the solder balls solidify first, thereby holding the panels together as the tin on the traces solidifies.

Another approach, for the case where the bimetal foil is Cu/Al/Cu, is to electroplate the tin on the copper and/or the aluminum, separately or at the same time, after pre-treating the base metal with a surface preparation such as, for example, the Alstan surface preparation (by Atotech USA, Inc.).

Another approach to fabricating a 3-layer PCB is to use adhesion between pre-preg on one panel and pre-preg on the other panel to form a mechanical coupling of the two panels. In one implementation, polyimide pre-preg is laminated to a future inner side of a polyimide core. The pre-preg can be partially cured prior to forming the bimetal foil. The cure of the pre-preg can be completed during lamination of the two panels, causing pre-preg not covered by metal to help fuse the two panels together.

In some implementations, as described above, the panels include a core formed of polyimide with partially-cured polyimide pre-preg laminated on the future inner side each. Holes can be drilled through the panels using a mechanical drill bit or a laser drill. An advantage of laser drilling is that the heat from the laser can cure the pre-preg locally, resulting in greater stability of the vias during copper-plating.

Alternatively, or in addition, an acrylic photo-imageable layer (such as for example Dupont Riston® Dryfilm) can be applied to the future inner side of each panel after the traces and vias plated by superconductive metal have been tinned as described above. The Dryfilm can be imaged such that it remains on the panel in areas where there are no traces, i.e., in areas where the polyimide core is visible. The process can include pressing the two panels together with sufficient pressure and temperature to heat-weld the acrylic, and melt the tin to form a superconducting electrical connection.

In some implementations, the laminating process can include filling gaps between the two panels. An example approach to filling gaps between the two panels is as follows:
  protecting the future outer side;
  drilling holes to expose the gaps; and
  placing the PCB under a vacuum and sucking a low-viscosity epoxy into the gaps, and curing the epoxy.

In some implementations, the laminating process can be repeated at least once, i.e., the PCB re-heated and the panels pressed together another time.

In an implementation where the vias were filled with epoxy, the protective tape or Dryfilm can be removed after lamination, and the PCB can include at least substantially only exposed copper and dielectric. The PCB may include exposed tin and/or superconducting metal around the edges of the PCB. This can be incompatible with typical PCB-manufacturing chemistry, and so it can be advantageous to seal the edge by dipping it in an epoxy, and curing the epoxy.

In one implementation, a ground plane can be formed around the perimeter of the PCB. One approach is to form a "fence" of aligned vias using solder balls as described above to fuse the vias, and maintain the integrity of the lamination of the two panels.

The outer layer of Cu/Al/Cu can be patterned in a manner essentially the same as a 2-layer superconducting PCB.

In the various embodiments and implementations described above, the description refers to a 3-layer PCB. Those of skill in the art will appreciate that, in some embodiments and implementations, the PCB may have three layers or more, for example a multilayer PCB may have 4 layers. A 3-layer PCB includes 2 panels with 2 outer layers (top and bottom) and 1 inner layer. A 4-layer PCB includes 3 panels with 2 outer layers and 2 inner layers. More generally, an n-layer PCB includes (n-1) panels with 2 outer layers, and (n-2) inner layers.

FIGS. 2A, 2B, 2C, 2D, and 2E are cross-sectional views of a multilayer printed circuit board (PCB) 200 at different stages of a fabrication process, according to one illustrated implementation of the present disclosure.

Figure 2A:
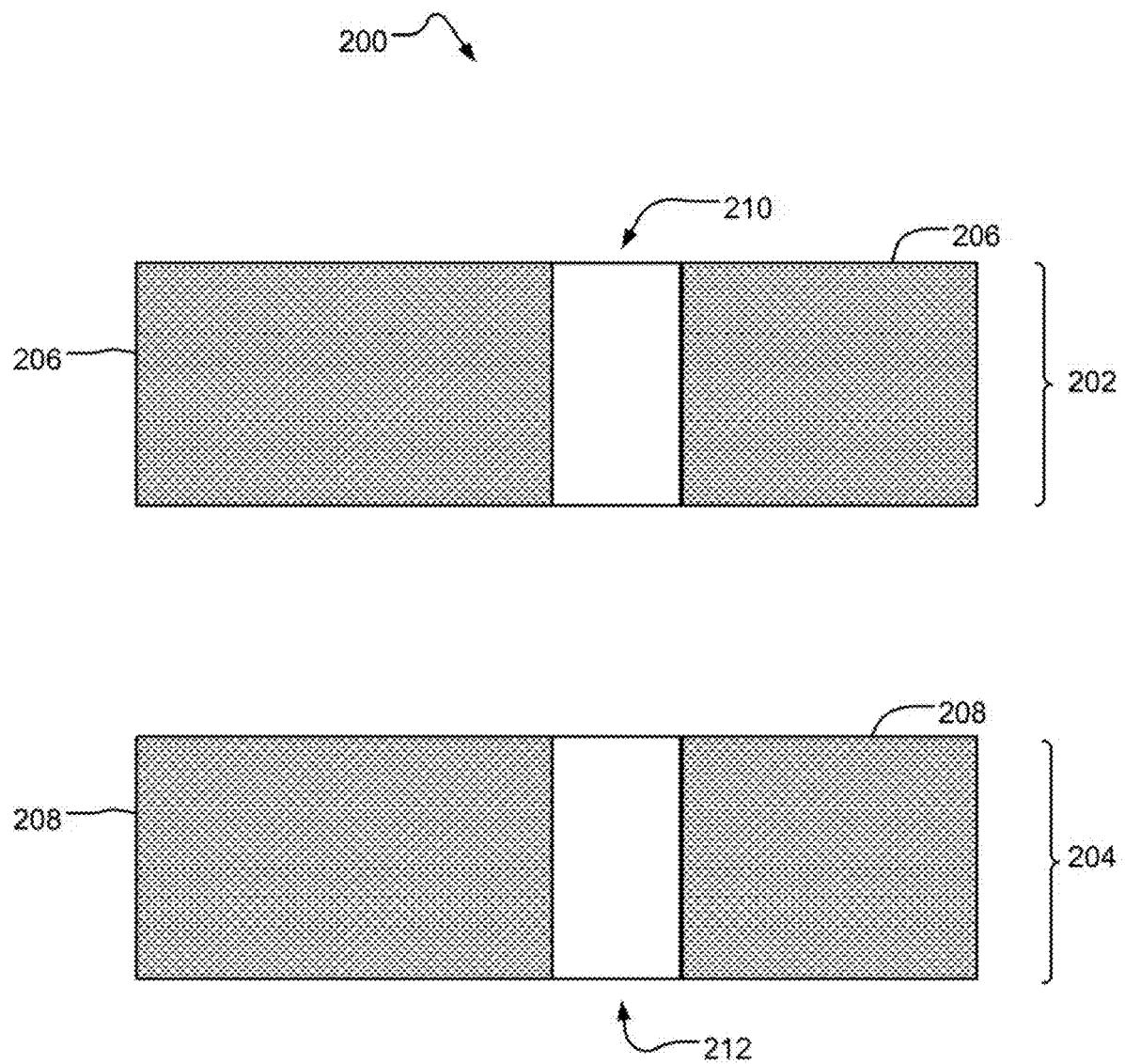

Referring to FIG. 2A, PCB 200 comprises two panels 202 and 204. Panel 202 comprises an electrically insulative substrate core 206, and panel 204 comprises an electrically insulative substrate core 208. In one implementation, cores 206 and 208 comprise polyimide. PCB 200 comprises a hole 210 formed in core 206, and a hole 212 formed in core 208. In one implementation, holes 210 and 212 are drilled holes.

Figure 2B:
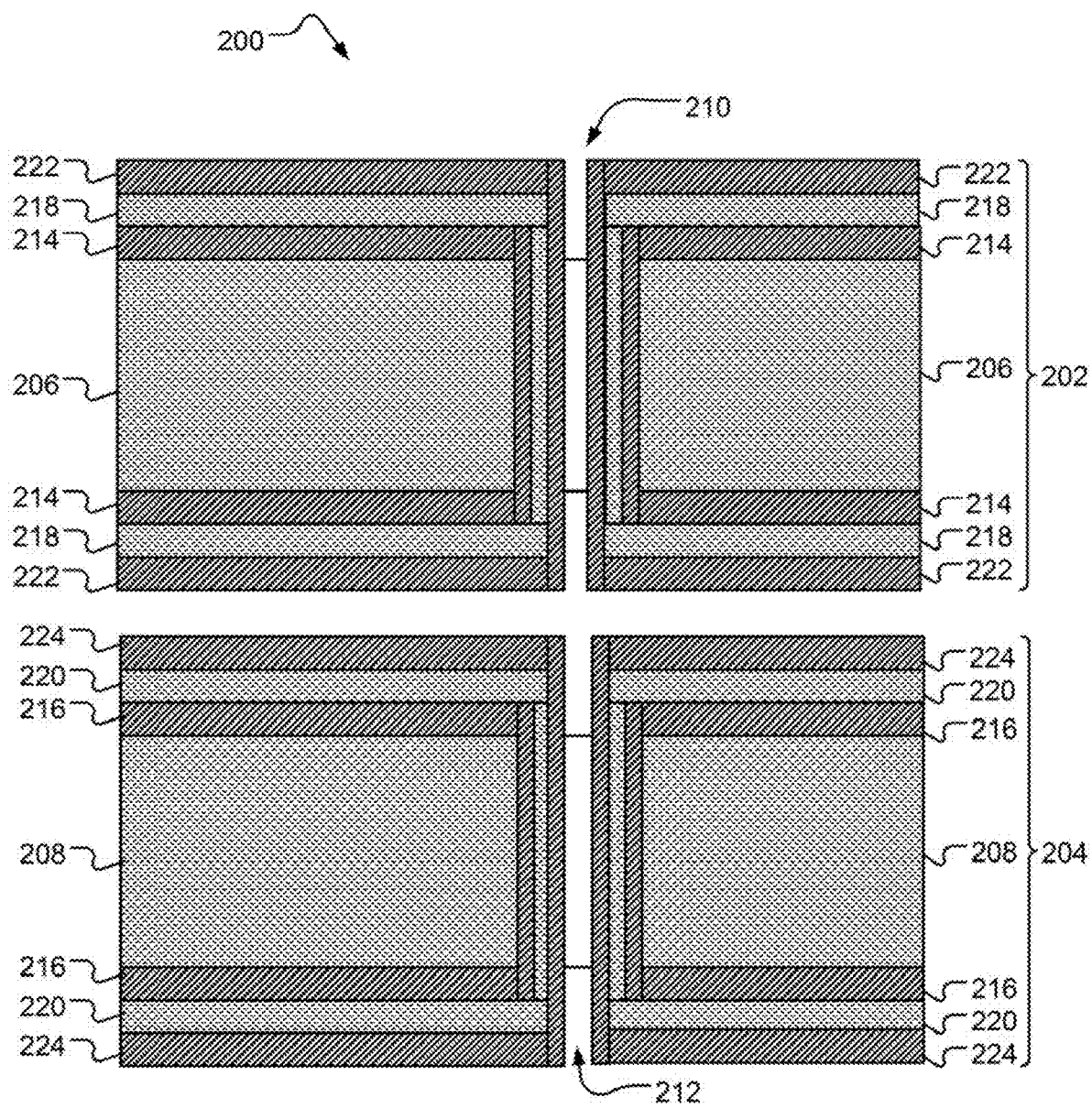

Referring to FIG. 2B, the fabrication process deposits a bimetal foil on cores 206 and 208. Bimetal foil comprises:
i) a layer 214 of a first metal overlying core 206 of panel 202;
ii) a layer 216 of a first metal overlying core 208 of panel 204;
iii) a layer 218 of a second metal overlying layer 214;
iv) a layer 220 of a second metal overlying layer 216;
v) a layer 222 of the first metal overlying layer 218; and
vi) a layer 224 of the first metal overlying layer 220.

In one implementation, the first metal is copper, and the second metal is aluminum. In one implementation, depositing copper on panels 202 and 204 includes plating copper on panels 202 and 204, and depositing aluminum on the copper includes plating aluminum on the copper.

In other implementations, the second metal is one of lead, niobium, tin, or another suitable superconducting metal.

Figure 2C:
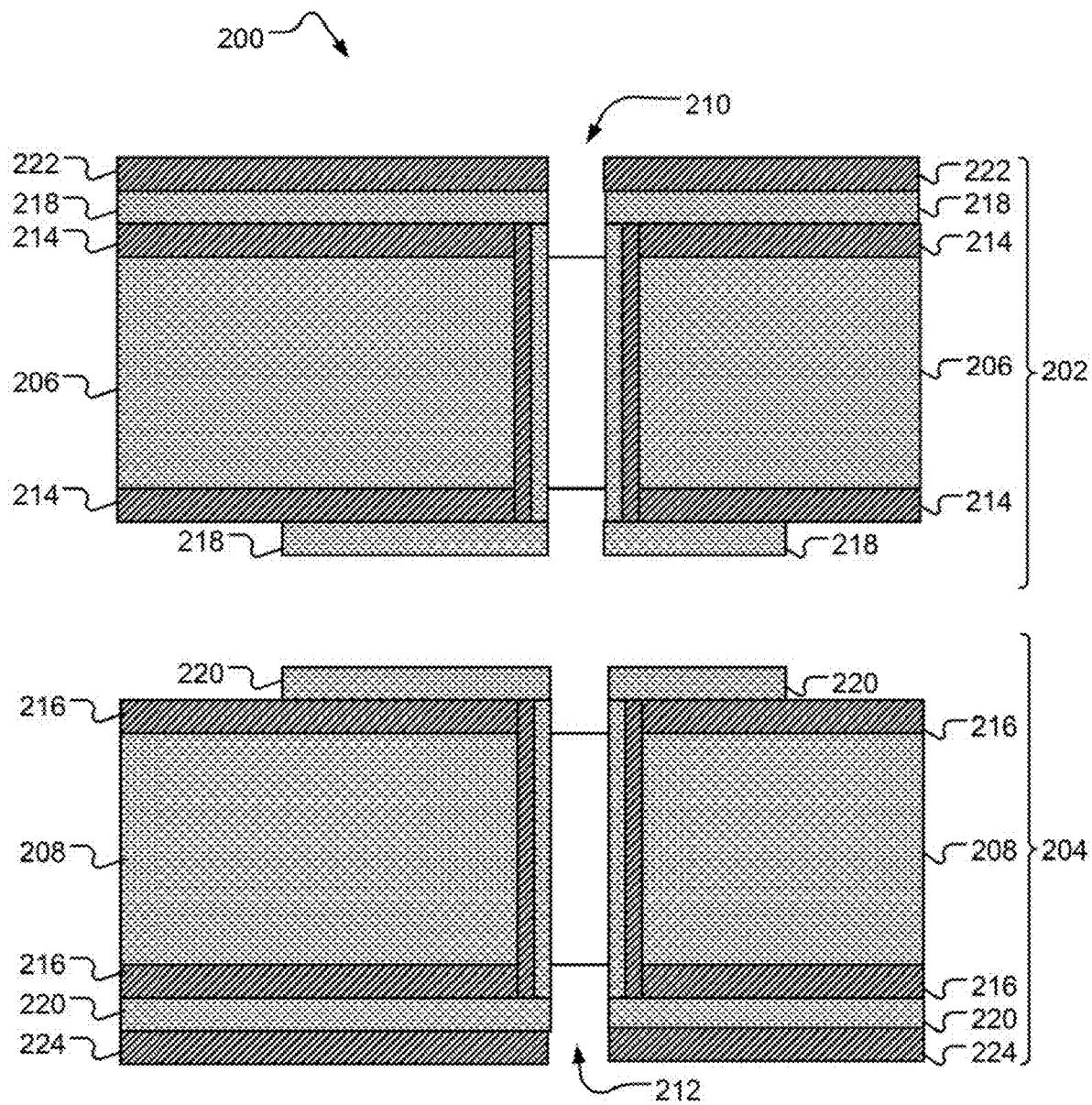

Referring to FIG. 2C, one side of panels 202 and 204 are patterned by removing copper and forming aluminum traces. This side can become an inner layer of the multilayer PCB.

Figure 2D:
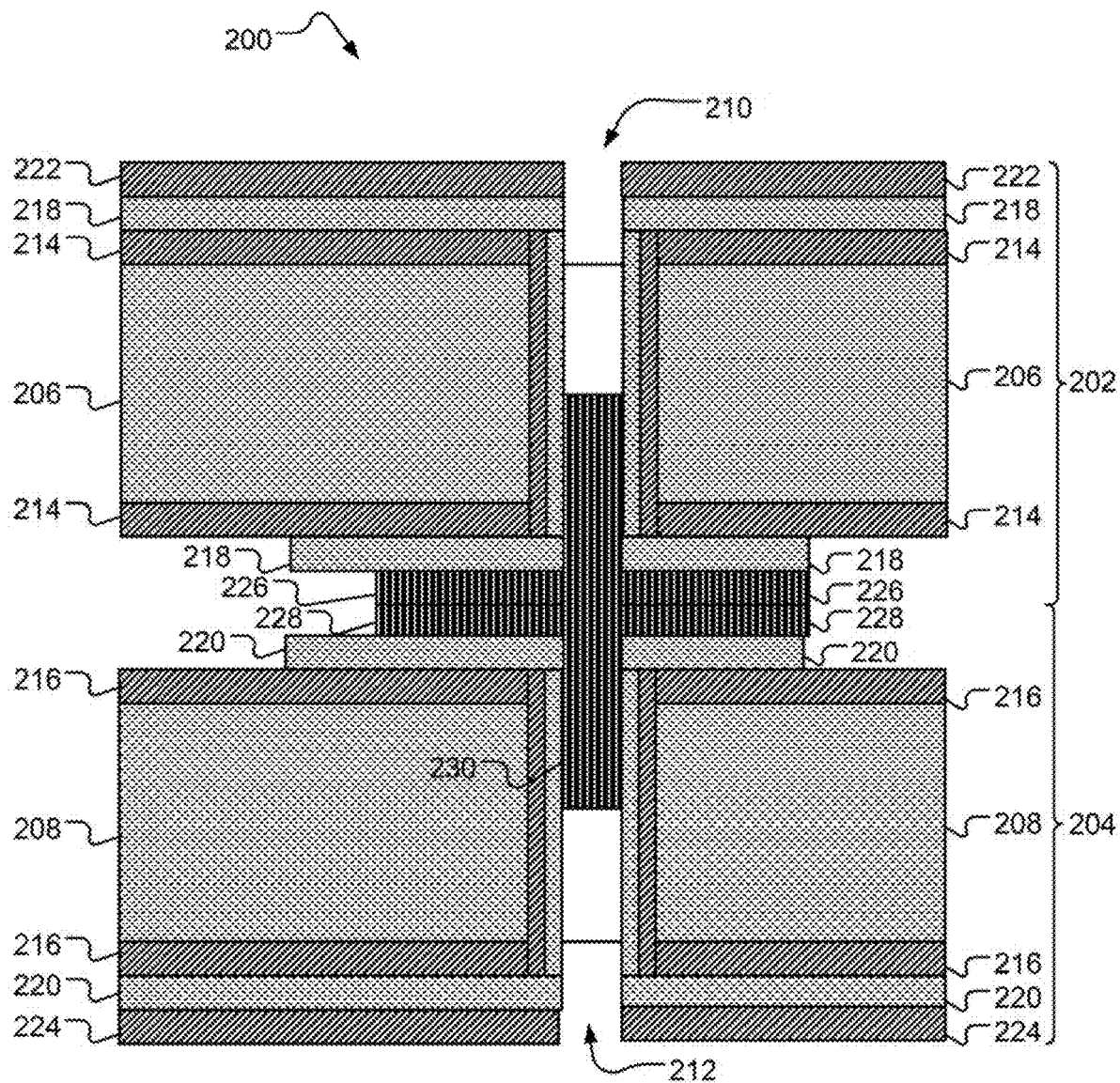

Referring to FIG. 2D, the fabrication process deposits a layer 226 of a third metal on layer 218. In one implementation, the third metal is tin, and depositing layer 226 includes tin-plating layer 226 to overlie layer 218. The fabrication process deposits a layer 228 of a third metal on layer 220. In one implementation, the third metal is tin, and depositing layer 228 includes tin-plating layer 228 to overlie layer 220.

Panels 202 and 204 are laminated together using heat and/or pressure to cause layers 226 and 228 to fuse and form a) a mechanical coupling of panels 202 and 204, and b) a superconductive electrical coupling between traces on panels 202 and 204.

Figure 2E:
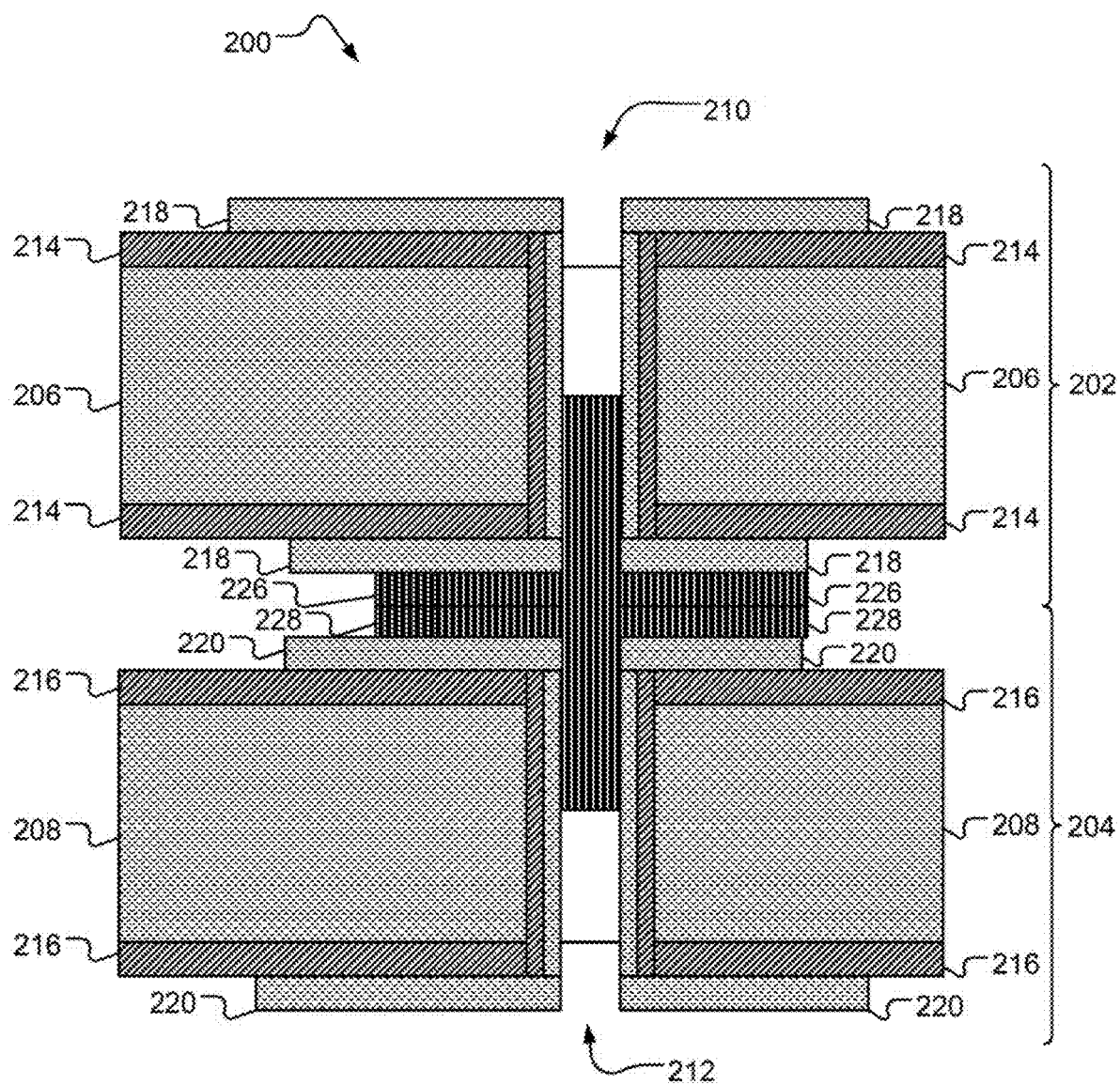

Referring to FIG. 2E, the other side of panels 202 and 204 are patterned by removing copper and forming aluminum traces. This side can become an outer layer of the multilayer PCB.

The fabrication process of the multilayer superconducting PCB illustrated in FIGS. 2A, 2B, 2C, 2D, and 2E is described in more detail above.

Figure 3:
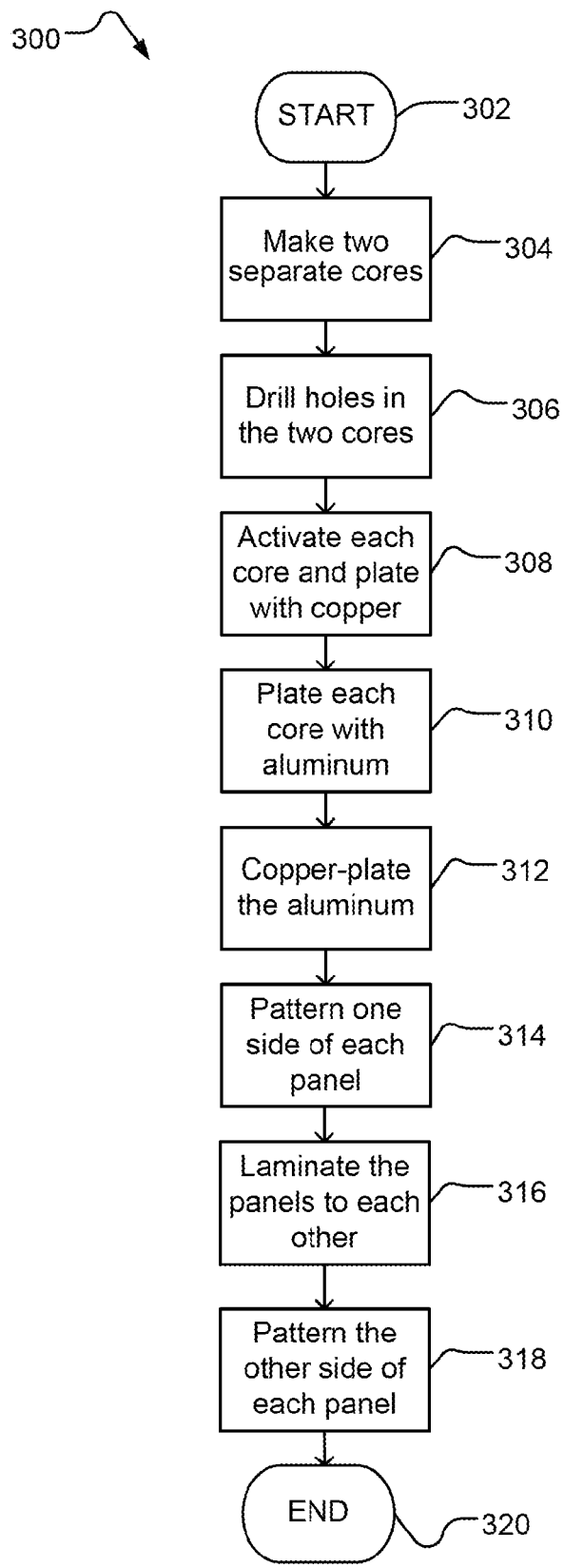
FIG. 3 is a flow chart illustrating a method for fabricating a multilayer superconducting printed circuit board, according to one illustrated implementation of the present disclosure.

FIG. 3 is a flow chart illustrating a method 300 for fabricating a multilayer superconducting printed circuit board, according to one illustrated implementation of the present disclosure. Method 300 includes acts 302-320, though those skilled in the art will appreciate that in alternative implementations certain acts may be omitted and/or additional acts may be added. Those skilled in the art will appreciate that the order of the acts is shown for exemplary purposes only and may change in alternative implementations.

At 302, the method starts. At 304, two separate cores comprising an electrically insulative substrate are made. At 306, one or more holes are drilled or formed in each of the two cores. At 308, each core is activated, and the electrically insulative substrate is copper-plated. At 310, each copper-plated core is plated with aluminum. At 312, the aluminum-plated core is plated with copper to form two panels each comprising a bimetal foil of Cu/Al/Cu. Other implementations may use other suitable bimetal foils.

At 314, one side of each core is patterned. This side becomes an inner layer of the multilayer PCB. At 316, the two panels are laminated to each other to form a multilayer superconducting PCB. At 318, the other side (i.e., the outer side) of each panel is patterned. At 320, the method ends.

Method 300 is described in more detail above, and in reference to FIGS. 2A, 2B, 2C, 2D, and 2E.

Figure 4:
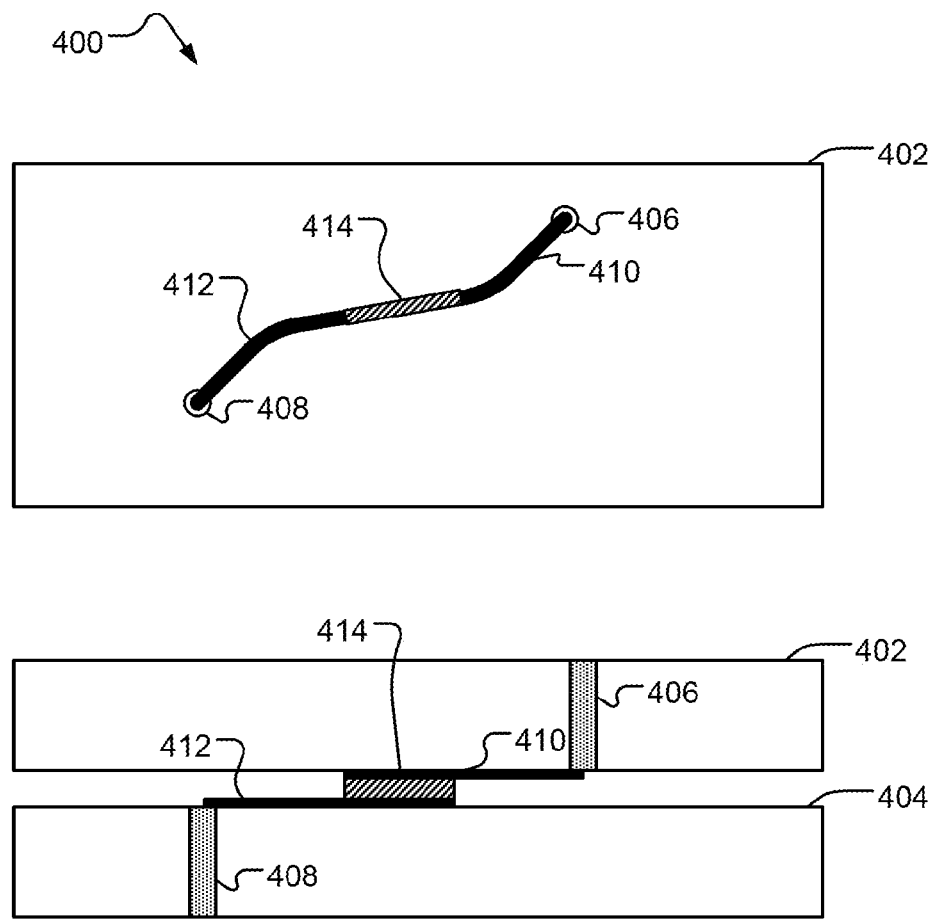
FIG. 4 is a set of two cross-sectional views of a multilayer PCB, according to one illustrated implementation of the present disclosure.

FIG. 4 is a set of two cross-sectional views of a multilayer PCB 400, according to one illustrated implementation of the present disclosure. PCB 400 comprises two cores 402 and 404. Core 402 comprises a via 406, and core 404 comprises a via 408. Vias 406 and 408 may be superconducting vias. Core 402 further comprises a trace 410, and core 404 further comprises a trace 412. Traces 410 and 412 may be superconducting traces. Traces 410 and 412 may comprise a superconducting metal such as aluminum for example.

As shown in FIG. 4, traces 410 and 412 can be joined by a segment of superconducting metal 414. In one implementation, superconducting metal 414 includes tin. Superconducting metal 414 can provide a superconducting electrical coupling between traces 410 and 412. Superconducting metal 414 can provide a mechanical coupling of cores 402 and 404 to form a multilayer PCB.

In one implementation, superconducting vias 406 and 408, traces 410 and 412, and the segment of superconducting metal 414 form a superconducting electrical communicative path.

In some embodiments of the present systems, methods and apparatus, it may be advantageous to secure a distinct plug or core of material inside a superconducting via. In some applications, the superconducting metal that plates the inner surface of a superconducting via may fragment or detach from the inner surface of the via. The likelihood of this fragmentation may be reduced by inserting a distinct plug or core inside the superconducting via. For example, a piece of wire, such as copper wire, may be inserted inside a superconducting via. This wire may be secured in place, for example, by a solder connection and/or by bending the ends of the wire that may protrude from the superconducting via. Placing such a wire in a superconducting via may help to protect the surface of the superconducting via and hold the superconducting plating in place.

According to the present state of the art, a superconducting material may generally only act as a superconductor if it is cooled below a critical temperature that is characteristic of the specific material in question. For this reason, those of skill in the art will appreciate that a system that implements superconducting devices may implicitly include a system for cooling the superconducting materials in the system. Systems and methods for such cooling are well known in the art. A dilution refrigerator is an example of a system that is commonly implemented for cooling a superconducting material to a temperature at which the superconducting material may act as a superconductor. In common practice, the cooling process in a dilution refrigerator may use a mixture of at least two isotopes of helium (such as helium-3 and helium-4). Full details on the operation of typical dilution refrigerators may be found in F. Pobell, *Matter and Methods at Low Temperatures*, Springer-Verlag Second Edition, 1996, pp. 120-156. However, those of skill in the art will appreciate that the present systems, methods and apparatus are not limited to applications involving dilution refrigerators, but rather may be applied using any type of cooling system.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to multilayer superconducting PCB systems, methods and apparatus, not necessarily the exemplary multilayer superconducting PCB systems, methods, and apparatus generally described above.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. Provisional Patent Application Ser. No. 60/979,031, filed Oct. 10, 2007, entitled "Systems, Methods and Apparatus for Multilayer Superconducting Printed Circuit Boards", U.S. patent application Ser. No. 12/016,801, U.S. patent application Ser. No. 12/016,709, U.S. Pat. No. 8,315,678 entitled "Systems, Methods, and Apparatus for Multilayer Superconducting Printed Circuit Boards", U.S. Provisional Patent Application Ser. No. 60/881,358, filed Jan. 18, 2007, entitled "Input/Output Systems and Devices for Use with Superconducting Based Computing Systems", U.S. Pat. No. 8,441,329 entitled "Input/Output Systems and Devices for Use with Superconducting Based Computing Systems", U.S. Provisional Patent Application Ser. No. 62/431,333, filed Dec. 7, 2016, entitled "Multilayer Superconducting Printed Circuit Board Related Systems, Methods, And Apparatus" and U.S. Pat. No. 8,008,991 entitled "Systems, Methods and Apparatus for Electrical Filters" are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of fabricating a multilayer superconducting printed circuit board, the method comprising:
    forming a first set of holes in a first electrically insulative substrate having a first surface and a second surface, the second surface opposed to the first surface across a thickness of the first electrically insulative substrate, each hole of the first set of holes forming a respective channel between the first surface and the second surface;
    forming a first panel by depositing a first bimetal foil to overlie at least a first portion of the first electrically insulative substrate;
    forming a second set of holes in a second electrically insulative substrate having a third surface and a fourth surface, the fourth surface opposed to the third surface across a thickness of the second electrically insulative substrate, each hole of the second set of holes forming a respective channel between the third surface and the fourth surface;
    forming a second panel by depositing a second bimetal foil to overlie at least a second portion of the second electrically insulative substrate, wherein the first and the second bimetal foils each comprise a first metal that is non-superconductive in a range of temperatures and a second metal that is superconductive in the range of temperatures;
    patterning a first side of the first panel to form one or more exposed traces of the second metal on the first side of the first panel;
    patterning a second side of the second panel to form one or more exposed traces of the second metal on the second side of the second panel;
    plating the first and the second panel to deposit a third metal on at least one of the one or more exposed traces of the second metal to form one or more traces of the second metal plated with the third metal, wherein the third metal is superconductive in the range of temperatures; and
    joining the first and the second panels to form at least a three-layer superconducting printed circuit board comprising an inner layer, two outer layers, and one or more superconducting vias providing a superconductive electrical coupling between the inner layer and at least one of the two outer layers.

2. The method of claim 1 wherein depositing a first bimetal foil to overlie at least a first portion of the first electrically insulative substrate includes depositing a first bimetal foil wherein the first metal comprises copper, and wherein depositing a second bimetal foil to overlie at least a second portion of the second electrically insulative substrate includes depositing a second bimetal foil wherein the first metal comprises copper.

3. The method of claim 2 wherein forming a first panel by depositing a first bimetal foil to overlie at least a first portion of the first electrically insulative substrate includes:
    at least partially copper-plating the first electrically insulative substrate to form a first copper-plated substrate;
    depositing a first superconducting metal on at least part of the first copper-plated substrate to form a first superconductive substrate; and
    at least partially copper-plating the first superconductive substrate to form the first panel; and wherein forming a second panel by depositing a second bimetal foil to overlie at least a second portion of the second electrically insulative substrate includes:
    at least partially copper-plating the second electrically insulative substrate to form a second copper-plated substrate;
    depositing a second superconducting metal on at least part of the second copper-plated substrate to form a second superconductive substrate; and
    at least partially copper-plating the second superconductive substrate to form the second panel.

4. The method of claim 1 wherein plating the first and the second panel to deposit a third metal on at least one of the one or more exposed traces of the second metal to form one or more traces of the second metal plated with the third metal includes tin-plating the first and the second panel to deposit tin on at least one of the one or more exposed traces of the second metal to form one or more tin-plated traces.

5. The method of claim 4 wherein joining the first and the second panels includes positioning the first side of the first panel adjacent to the second side of the second panel, to establish electrical contact between at least one of the tin-plated traces on the first side of the first panel with at least one of the tin-plated traces on the second side of the second panel.

6. The method of claim 1 wherein patterning a first side of the first panel to form one or more exposed traces of the second metal on the first side of the first panel includes removing a portion of the second metal overlying the first metal on the first side of the first panel, and wherein patterning a second side of the second panel to form one or more exposed traces of the second metal on the second side of the second panel includes removing a portion of the second metal overlying the first metal on the second side of the second panel.

7. The method of claim 1 wherein forming a first set of holes in a first electrically insulative substrate includes drilling a first set of holes in a first electrically insulative substrate, and wherein forming a second set of holes in a second electrically insulative substrate includes drilling a second set of holes in a second electrically insulative substrate.

8. The method of claim 1 wherein the first and the second electrically insulative substrate comprises partially-cured pre-preg, and wherein joining the first and the second panels includes further curing of the partially-cured pre-preg.

9. The method of claim 1 wherein joining the first and the second panels includes laminating the first and the second panels.

10. A multilayer superconducting printed circuit board comprising:
a first panel, the first panel comprising:
a first electrically insulative substrate, the first electrically insulative substrate comprising a first through-hole;
a first bimetal foil overlying at least a portion of the first electrically insulative substrate; and
a first plurality of traces patterned in the first bimetal foil on an inner side of the first panel;
a second panel, the second panel comprising:
a second electrically insulative substrate, the second electrically insulative substrate comprising a second through-hole;
a second bimetal foil overlying at least a portion of the second electrically insulative substrate; and
a second plurality of traces patterned in the second bimetal foil on an inner side of the second panel; and
a superconducting metal that is superconductive in a range of temperatures between the inner side of the first panel and the inner side of the second panel, wherein at least one of the first plurality of traces is superconductingly electrically communicatively coupled to at least one of the second plurality of traces by the superconducting metal.

11. The multilayer superconducting printed circuit board of claim 10 wherein at least one of the first and the second electrically insulative substrate comprises at least one of polyimide and a polytetrafluoroethylene (PTFE) composite.

12. The multilayer superconducting printed circuit board of claim 10 wherein at least one of the first and the second through-hole is a drilled hole.

13. The multilayer superconducting printed circuit board of claim 10 wherein each of the first and the second bimetal foil comprises:
a respective first instance of a first metal overlying the first electrically insulative substrate, where the first metal is non-superconductive in the range of temperatures;
a respective instance of a second metal overlying the first instance of the first metal, where the second metal is different from the first metal, and the second metal is superconductive in the range of temperatures.

14. The multilayer superconducting printed circuit board of claim 13 wherein each of the first and the second bimetal foil further comprises:
a respective second instance of the first metal overlying the instance of the second metal.

15. The multilayer superconducting printed circuit board of claim 13 wherein the first metal is copper, and the second metal is a metal selected from the group consisting of aluminum, lead, tin, and niobium.

16. The multilayer superconducting printed circuit board of claim 10 further comprising:
a third plurality of traces patterned in the first bimetal foil on an outer side of the first panel; and
a fourth plurality of traces patterned in the second bimetal foil on an outer side of the second panel, wherein at least one trace of the third and the fourth plurality of traces is superconductingly electrically communicatively coupled to at least one trace of the first and the second plurality of traces in the range of temperatures.

17. The method of claim 2 wherein depositing a first bimetal foil to overlie at least a first portion of the first electrically insulative substrate includes depositing a first bimetal foil wherein the second metal comprises aluminum, and wherein depositing a second bimetal foil to overlie at least a second portion of the second electrically insulative substrate includes depositing a second bimetal foil wherein the second metal comprises aluminum.

18. The method of claim 17 wherein plating the first and the second panel to deposit a third metal on at least one of the one or more exposed traces of the second metal to form one or more traces of the second metal plated with the third metal includes zincating aluminum of the first and the second bimetal foil to deposit zinc on at least one of the one or more exposed traces of aluminum to form one or more zincated aluminum traces.

19. The method of claim 17 wherein forming a first panel by depositing a first bimetal foil to overlie at least a first portion of the first electrically insulative substrate includes:
at least partially copper-plating the first electrically insulative substrate to form a first copper-plated substrate;
at least partially aluminum-plating the first copper-plated substrate to form a first aluminum-plated substrate; and
at least partially copper-plating the first aluminum-plated substrate to form the first panel; and wherein forming a second panel by depositing a second bimetal foil to overlie at least a second portion of the second electrically insulative substrate includes:
at least partially copper-plating the second electrically insulative substrate to form a second copper-plated substrate;
at least partially aluminum-plating the second copper-plated substrate to form a second aluminum-plated substrate; and at least partially copper-plating the second aluminum-plated substrate to form the second panel.

20. The method of claim 17 wherein plating the first and the second panel to deposit a third metal on at least one of the one or more exposed traces of the first metal to form one or more traces of the first metal plated with the third metal includes tin-plating the first and the second panel to deposit tin on at least one of the one or more exposed aluminum traces to form one or more tin-plated aluminum traces.

21. The method of claim 20 wherein joining the first and the second panels includes positioning the first side of the first panel adjacent to the second side of the second panel, and establishing electrical contact between at least one of the tin-plated aluminum traces on the first side of the first panel with at least one of the tin-plated aluminum traces on the second side of the second panel.

22. The method of claim 3 wherein depositing a first superconducting metal on at least part of the first copper-plated substrate to form a first superconductive substrate includes depositing aluminum on at least part of the first copper-plated substrate, and depositing a second superconducting metal on at least part of the second copper-plated substrate to form a second superconductive substrate includes depositing aluminum on at least part of the second copper-plated substrate.

* * * * *